(12) United States Patent
Iwaya et al.

(10) Patent No.: US 7,947,600 B2
(45) Date of Patent: May 24, 2011

(54) MANUFACTURING METHOD FOR MICRO-TRANSFORMERS

(75) Inventors: Masanobu Iwaya, Matsumoto (JP);
Reiko Hiruta, Matsumoto (JP);
Katsunori Ueno, Matsumoto (JP);
Kunio Mochizuki, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 251 days.

(21) Appl. No.: 12/109,335

(22) Filed: Apr. 24, 2008

(65) Prior Publication Data

US 2009/0280646 A1 Nov. 12, 2009

(30) Foreign Application Priority Data

Apr. 27, 2007 (JP) ................................. 2007-119638

(51) Int. Cl.
*H01L 21/44* (2006.01)
(52) U.S. Cl. ......................... 438/666; 323/250
(58) Field of Classification Search ........................ None
See application file for complete search history.

(56) References Cited

U.S. PATENT DOCUMENTS

| 6,389,063 | B1 | 5/2002 | Kanekawa et al. | |
|---|---|---|---|---|
| 2006/0189023 | A1* | 8/2006 | Chang et al. | 438/69 |
| 2006/0223285 | A1* | 10/2006 | Shigematsu et al. | 438/463 |
| 2007/0216377 | A1* | 9/2007 | Yoshimura | 323/250 |

FOREIGN PATENT DOCUMENTS

| JP | 11-196136 A | 7/1999 |
|---|---|---|
| JP | 2001-148277 A | 5/2001 |

OTHER PUBLICATIONS

Stecher et al.; "Key Technologies for System-Integration in the Automotive and Industrial Applications"; IEEE Transactions on Power Electronics; May 2005; pp. 537-549; vol. 20, No. 3.
Munzer et al.; "Coreless Transformer a New Technology for Half Bridge Driver IC's " PCIM Nuremberg, 2003.
Volke et al.; "IGBT/MOSFET Applications based on Coreless Transformer Driver IC 2ED020I12-F".

* cited by examiner

*Primary Examiner* — David Vu
*Assistant Examiner* — Shantanu C Pathak
(74) *Attorney, Agent, or Firm* — Rossi, Kimms & McDowell LLP (57) ABSTRACT

A micro-transformer manufacturing method is provided, which can improve throughput, prevent a crack from entering an insulating film between coils, and manufacture the micro-transformer without using a mask material having a high selection ratio. An insulating film is deposited on the whole face of a semiconductor substrate having an impurity-diffused region. This insulating film is partially removed to form a first opening and a second opening. A primary coil is formed such that a center pad contacts the impurity-diffused region through the first opening. A thin insulating film is deposited on the primary coil. An insulator material having a secondary coil formed thereon is adhered onto the insulating film on the primary coil by adhesive tape. The insulator material is sized to not cover both a pad, connected with the center pad of the primary coil through the impurity-diffused region, and an outer-end pad of the primary coil.

6 Claims, 5 Drawing Sheets

MANUFACTURING METHOD FOR MICRO-TRANSFORMERS

BACKGROUND

The invention relates to a method for manufacturing a micro-transformer to perform signal transmissions between electrically insulated electric circuits.

In the related art, there are systems for performing signal transmissions between electrically insulated electric circuits so that a dangerous voltage may not pass when a high-voltage such as a surge is applied. One of those systems utilizes an inductive coupling by a transformer (as referred to in JP-A-11-196136 [corresponding to U.S. Pat. No. 6,389,063], for example).

As the recent MEMS (Micro Electro Mechanical Systems) technique improves, the transformer becomes smaller. This makes it possible to integrate the transformer and an integrated circuit. In the following, this small-sized transformer will be called the micro-transformer, and the signal transmission system using the micro-transformer is called the micro-transformer system (as referred to, for example, in JP-B-2001-148277 and in "Key Technologies for System-Integration in the Automotive and Industrial Applications", IEEE TRANSACTIONS ON POWER ELECTRONICS, VOL. 20, NO. 3, May, 2005.

Figure 10:
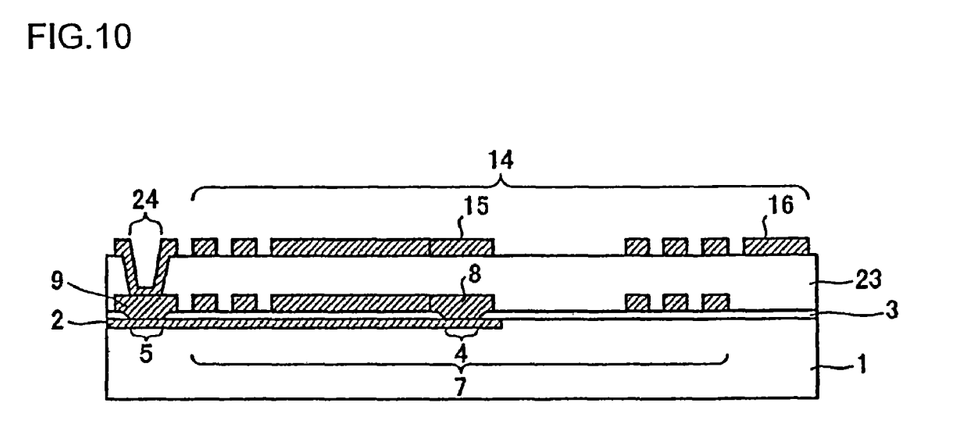
FIG. 10 is a sectional view showing a constitution of the micro-transformer of the related art.

FIG. 10 is a sectional view showing a structure of a micro-transformer of the related art. As shown in FIG. 10, the micro-transformer is equipped with a primary coil 7 and a secondary coil 14. These primary coil 7 and secondary coil 14 are separated from each other by an insulating film 23. In order to retain a desired resistance to an electrostatic discharge (ESD: Electro Static Discharge), moreover, the micro-transformer of the related art has to be made such that the thickness of the insulating film 23 is 10 µm or more.

Figure 11:
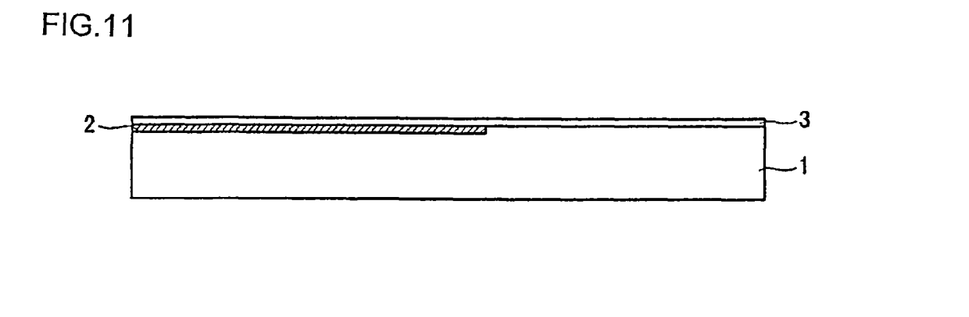
FIG. 11 is a sectional view showing a step of the manufacturing method of the micro-transformer of the related art.
Figure 12:
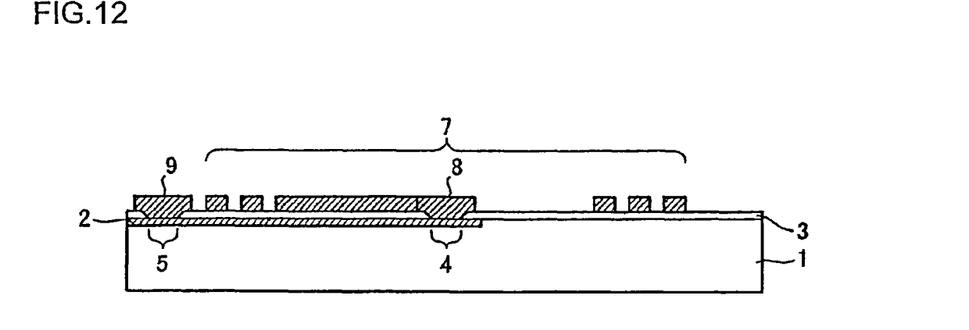
FIG. 12 is a sectional view showing a step of the manufacturing method of the micro-transformer of the related art.
Figure 13:
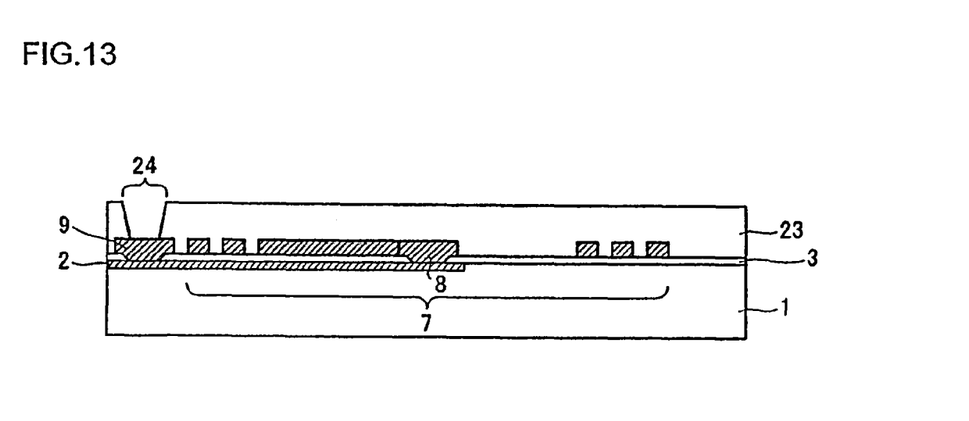
FIG. 13 is a sectional view showing a step of the manufacturing method of the micro-transformer of the related art.

Next, the method for manufacturing the micro-transformer of the related art is described. FIG. 11 to FIG. 13 are sectional views sequentially showing the micro-transformer manufacturing method of the related art. First of all, an impurity-diffused region 2 is selectively formed on a semiconductor substrate 1, as shown in FIG. 11. Next, an insulating film 3 is formed to have a thickness of about 1 µm on the whole face of the substrate by the plasma CVD (Chemical Vapor Deposition) method or the like.

Next, as shown in FIG. 12, the insulating film 3 is partially removed by photolithography or the like to form a first opening 4 and a second opening 5. Then, a metal film is deposited to a thickness of about 3 µm on the whole face of the substrate, and the primary coil 7 is formed by photolithography or the like. At this time, a center pad 8 of the primary coil 7 is made to contact the impurity-diffused region 2 through the first opening 4. There is also formed a pad 9, which is electrically connected with the center pad 8 of the primary coil 7 through the impurity-diffused region 2. Moreover, the pad 9 is made to contact the impurity-diffused region 2 through the second opening 5. Still moreover, the outer-end pad is formed, although not shown, in the outer-end portion of the primary coil 7.

Next, an insulating film is deposited on the primary coil 7 by the plasma CVD method or the like, as shown in FIG. 13. Then, the surface of the insulating film is flattened to form the insulating film 23 having a thickness of 10 µm. Next, a portion of the insulating film 23 is removed by photolithography or the like to form an opening 24. Thus, the pad 9 is exposed at the opening 24 to the outside. Although not shown, moreover, the outer-end pad is exposed to the outside at the opening other than the region shown in FIG. 13.

Next, as shown in FIG. 10, a metal film is deposited on the insulating film 23, and the secondary coil 14 is formed by photolithography or the like. The shape of the secondary coil 14 is made substantially identical to that of the primary coil 7. In the secondary coil 14, a center pad 15 is formed at the center portion, and an outer-end pad 16 is formed at the outer-end portion. Simultaneously as the secondary coil 14 is formed, the opening 24 is covered with the metal film. In this case, the metal film covering the opening 24 contacts the pad 9, and becomes the electrode pad of the center-side end portion of the primary coil 7. Therefore, the signal from the primary coil 7 is accepted by the secondary coil 14 so that it can be transmitted to the outside from the center pad 15 of the secondary coil 14 and the outer-end pad 16 of the secondary coil.

However, the aforementioned manufacturing method of the related art is troubled by lower throughput because the insulating film 23 formed on the primary coil 7 must be thick. The large thickness of the insulating film 23 makes the insulating film 23 vulnerable to being cracked by stress. When the insulating film 23 is partially removed by etching, the throughput is lowered. When this etching is performed, a mask member having a high selection ratio must be used.

In view of the above, it would be preferable to provide a micro-transformer manufacturing method capable of improving the throughput. It would further be preferable to provide a micro-transformer manufacturing method capable of preventing the insulating film between the coils from being cracked. It would even further be preferable to provide a manufacturing method capable of manufacturing the micro-transformer without using a mask member having a high selection ratio.

SUMMARY OF THE INVENTION

According to a first aspect of the invention, a method for manufacturing a micro-transformer is provided. First, an impurity-diffused region is selectively formed on the surface of a semiconductor substrate. Next, a first insulating film is deposited on the surface of the semiconductor substrate having the impurity-diffused region. Moreover, a first opening and a second opening are individually formed so deeply in the first insulating film as to reach the impurity-diffused region. Next, a first conductive film is laminated on the first insulating film, the first opening and the second opening. The first conductive film is worked into a desired shape around the portion of the first conductive film over the first opening. Next, a second insulating film is deposited on the first insulating film and the first conductive film. A portion of the second insulating film is removed to expose the portion of the first conductive film over the second opening to the outside. By these operations, the primary coil is formed. A second conductive film is formed on the surface of an insulator material prepared separately from the semiconductor substrate. This second conductive film is worked into a desired shape. By these operations, the secondary coil is formed. Finally, the secondary coil is adhered onto the second insulating film of the primary coil with the insulator material being positioned below.

According to the first aspect of the invention, the second insulating film need not be deposited to a thickness necessary for a desired withstand voltage. As a result, it is possible to improve the throughput of the manufacturing method. Moreover, the second insulating film is made so thin that it can be prevented from being cracked by stress. Moreover, the insulator material for forming the secondary coil can be worked to the desired size so that the insulator material need not be removed by etching after it has been adhered to the primary coil side. As a result, it is possible to prevent the throughput from being lowered by etching. Moreover, the micro-transformer can be manufactured without using a mask material having a high selection ratio.

A micro-transformer manufacturing method according to a second aspect of the invention is characterized in that the face of that side of the insulator material, on which the second conductive film is not formed, is ground to thin the insulator material. According to the second aspect of the invention, when the secondary coil is to be formed, the insulator material is so thick that it can be prevented from being cracked. After the secondary coil was formed, moreover, the insulator material is thinned so that it can have a thickness necessary for the desired withstand voltage.

A micro-transformer manufacturing method according to a third aspect of the invention is characterized in that, after the second conductive film treatment, a third insulating film is deposited on the insulator material and the second conductive film. In the third insulating film, moreover, an opening is formed to reach the second conductive film.

According to the third aspect of the invention, after the third insulating film has been deposited in advance as a protecting film, the secondary coil can be adhered onto the second insulating film of the primary coil with the insulator material being positioned below. As a result, the second opening on the primary coil side is not covered with the third insulating film so that removal of the insulating film from over the second opening can be omitted.

A micro-transformer manufacturing method according to a fourth aspect of the invention is characterized in that, after the second conductive film was worked, a third insulating film is deposited on the insulator material and the second conductive film. Then, an opening is formed in the third insulating film to reach the second conductive film. Next, the face on that side of the insulator material, in which the second conductive film is not formed, is ground. As a result, the insulator material is thinned.

According to the fourth aspect of the invention, after the third insulating film has been deposited in advance as the protecting film on the secondary coil, the insulator material can be worked to the desired thickness. When the third insulating film is to be formed on the secondary coil, therefore, the insulator material is so thick that it can be prevented from being cracked. After the third insulating film was deposited on the secondary coil, moreover, the insulator material is thinned. Even when the insulating film is deposited on the secondary coil, therefore, it is possible to form the insulator material having a thickness necessary for the desired withstand voltage.

A micro-transformer manufacturing method according to a fifth aspect of the invention is characterized in that, after the second insulating film has been deposited, pattern registering markers for adhering the secondary coil to the second insulating film are formed. Moreover, the secondary coil is adhered onto the second insulating film of the primary coil with reference to the pattern registering markers, with the insulator material being positioned below.

According to the fifth aspect of the invention, the secondary coil side can be adhered with reference to the pattern registering markers formed on the primary coil side. As a result, it is possible to eliminate the dislocation between the primary coil side and the secondary coil side.

A micro-transformer manufacturing method according to a sixth aspect of the invention is characterized in that, before the second insulating film is deposited, the size of the insulator material is worked to a size matching the pattern registering markers. According to the sixth aspect of the invention, in case the insulator material having the secondary coil formed is not transparent, the size of the insulator material is worked to such a size as the pattern registering markers can be confirmed. With reference to the pattern registering markers formed on the primary coil side, therefore, the secondary coil side can be adhered. As a result, it is possible to eliminate the dislocation in the horizontal direction when the primary coil side and the secondary coil side are adhered.

The micro-transformer manufacturing method of the invention can attain improved throughput. Moreover, this invention can prevent the insulating film between the coils from being cracked. Still moreover, this invention can manufacture the micro-transformer without using a mask member having a high selection ratio.

BRIEF DESCRIPTION OF THE DRAWINGS

The invention will be described with respect to certain preferred embodiments and the accompanying drawings, wherein.

DESCRIPTION OF THE PREFERRED EMBODIMENTS

Preferred embodiments of a method for manufacturing a micro-transformer according to this invention are described in detail in the following with reference to the accompanying drawings.

Embodiment 1

Figure 1:
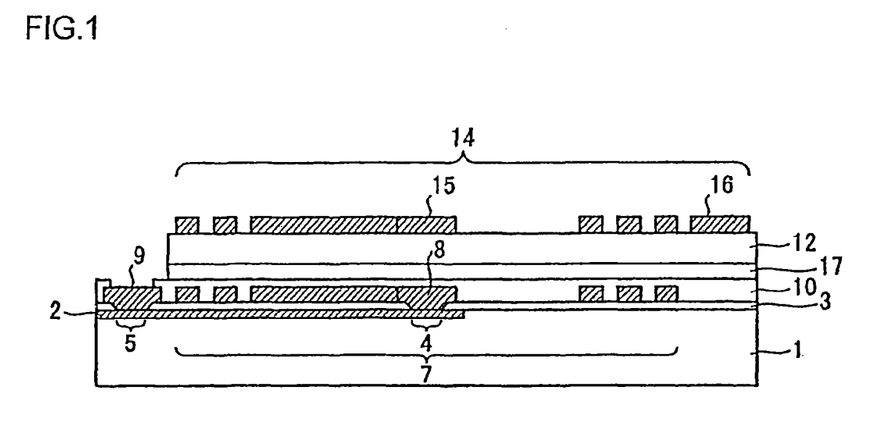
FIG. 1 is a sectional view showing a constitution of a micro-transformer manufactured by a manufacturing method according to Embodiment 1.

FIG. 1 is a sectional view showing the constitution of the micro-transformer manufactured by the manufacturing method according to Embodiment 1 of the invention. As shown in FIG. 1, the micro-transformer is equipped with a primary coil 7 and a secondary coil 14. The primary coil 7 and the secondary coil 14 are separated from each other by an insulating film 10, an adhesive tape 17 and an insulator material 12. Specifically, the insulating film 10 is made of an insulator such as an oxide, a nitride or polyimide. On the other hand, the insulator material 12 is specifically made of an insulator such as glass, quartz, sapphire, polyimide or ceramics, and is formed into a plate shape or a sheet shape. The adhesive tape 17 may be any type, if it is adhesive on its two faces and has a resistance to heat at subsequent bonding or the like. The adhesive tape 17 is specified by a DAF (Die Attach Film) tape or the like.

An impurity-diffused region 2 is selectively formed on the surface of a semiconductor substrate 1. An insulating film 3 is deposited on the whole face of the substrate including the impurity-diffused region 2. A first opening 4 and a second opening 5 are formed in that insulating film 3. The first opening 4 and the second opening 5 are formed in the central portion and the edge portion of the substrate, respectively. A center pad 8 of the primary coil 7 contacts the impurity-diffused region 2 through the first opening 4. Another pad 9 contacts the impurity-diffused region 2 through the second opening 5. Moreover, the pad 9 is not covered with the insulating film 10 but is exposed to the outside. As a result, the pad 9 is electrically connected with the center pad 8 of the primary coil 7 through the impurity-diffused region 2, and acts as an outgoing electrode of the center-side end portion of the primary coil 7. On the other hand, the outer-end portion of the primary coil 7 is equipped with an outer-end pad, although not appearing in FIG. 1. This outer-end pad is disposed in the depth of the pad 9, for example, in FIG. 1. This outer-end pad is not covered with the insulating film 10 but also exposed to the outside.

Figure 2:
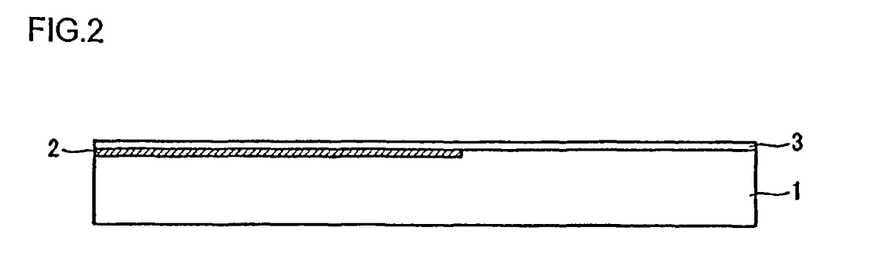
FIG. 2 is a sectional view showing formation of insulating film on a substrate a micro-transformer manufacturing method according to Embodiment 1.

FIG. 2 to FIG. 5 are sectional views sequentially showing the micro-transformer manufacturing method according to Embodiment 1 of the invention. First, the impurity-diffused region 2 is selectively formed on the surface of the semiconductor substrate 1, as shown in FIG. 2. The semiconductor substrate 1 is exemplified by a silicon substrate. Next, the insulating film 3 is formed on the whole face of the substrate by the plasma CVD method or the like. Here, the appropriate thickness of the insulating film 3 is about 1 μm, for example. Specifically, the insulating film 3 is an oxide film, a nitride film or a polyimide film.

Figure 3:
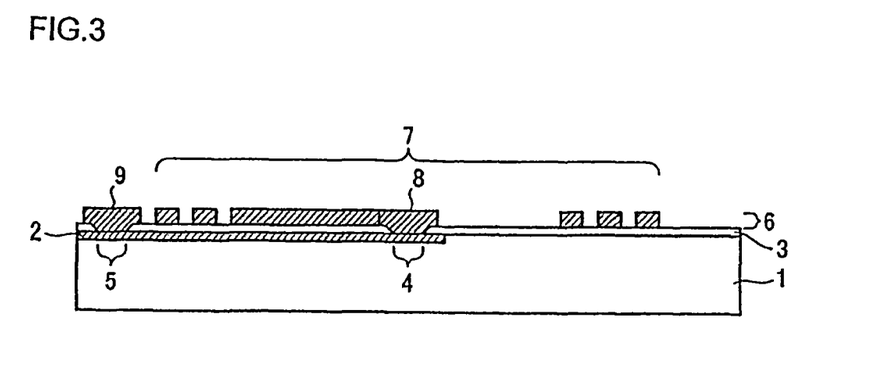
FIG. 3 is a sectional view showing formation of a primary coil in the micro-transformer manufacturing method according to Embodiment 1.

Next, as shown in FIG. 3, a portion of the insulating film 3 is removed by photolithography to form the first opening 4 and the second opening 5. Next, a metal film 6 is deposited on the whole face of the substrate. Here, the metal film 6 has an appropriate thickness of about 1 to 3 μm. Moreover, the metal film 6 may be thicker to lower the resistivity of the device. The metal film 6 contacts the impurity-diffused region 2 individually through the first opening 4 and the second opening 5.

Next, the metal film 6 is partially removed by photolithography or the like to form the primary coil 7. This primary coil 7 has a spiral shape, for example. This spiral top plan shape may also be a circular shape or an angular shape (e.g., a rectangular shape). The center pad 8 is formed at the center portion of the primary coil 7. Moreover, the not-shown outer-end pad is formed at the outer-end portion of the primary coil. The center pad 8 of this primary coil 7 contacts the impurity-diffused region 2 through the first opening 4. Simultaneously as the primary coil 7 is formed, moreover, the pad 9 is formed over the second opening 5. This pad contacts the impurity-diffused region 2 through the second opening 5.

Figure 4:
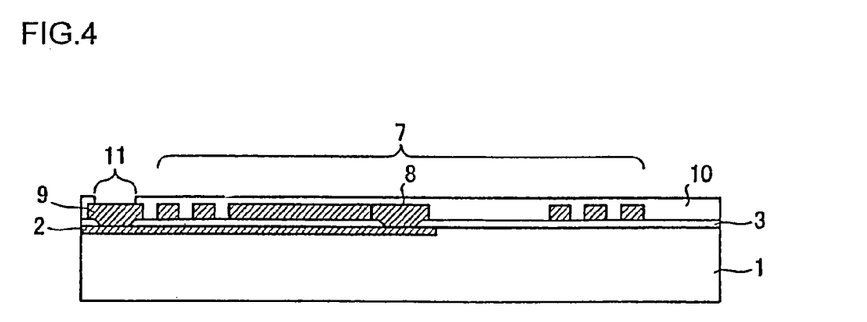
FIG. 4 is a sectional view showing deposition of an insulating film in the micro-transformer manufacturing method according to Embodiment 1.

Next, an insulating film is deposited on the whole face of the substrate by the plasma CVD method or the like, as shown in FIG. 4. Then, this film is polished to have its surface flattened thereby to form the insulating film 10. This insulating film 10 has an appropriate thickness of about 0 to 10 μm from the upper face of the primary coil 7. Thus, the primary coil 7 need not be covered with the insulating film 10. Specifically, the insulating film 10 may be polished so far as to reach the surface of the primary coil 7. In case the pad 9 and the outer-end pad are covered with the insulating film 10, the upper portion 11 of the pad 9 and the insulating film 10 over the outer-end pad are then partially removed by photolithography or the like. As a result, the pad 9 and the outer-end pad are exposed to the outside.

Figure 5:
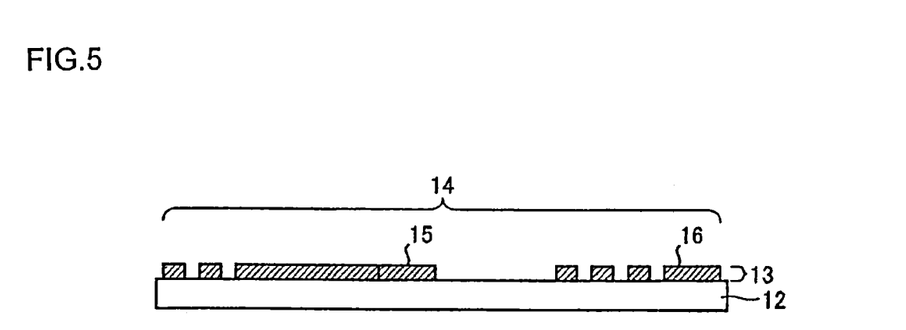
FIG. 5 is a sectional view showing formation of a secondary coil of the micro-transformer manufacturing method according to Embodiment 1.

As shown in FIG. 5, the insulator material 12 is prepared separately of the semiconductor substrate 1. The insulator material 12 has a thickness necessary for a withstand voltage according to an application of the micro-transformer. Specifically, the insulator material 12 has an appropriate thickness of about 20 to 200 μm. As shown in FIG. 5, a metal film 13 is deposited on the whole face of the insulator material 12. The metal film 13 has an appropriate thickness of about 1 to 3 μm. Moreover, a larger thickness of the metal film 13 may be proper to lower the resistivity of the device.

Next, the metal film 13 is partially removed by photolithography or the like to form the secondary coil 14. The shape of the secondary coil 14 is substantially the same as that of the primary coil 7. A center pad 15 is formed at the center portion of the secondary coil 14. Moreover, an outer-end pad 16 is formed on the outer-end portion of the secondary coil 14. Moreover, the insulator material 12 is sized so as not to cover the aforementioned pad 9 and the outer-end pad on the primary coil side.

Figure 6:
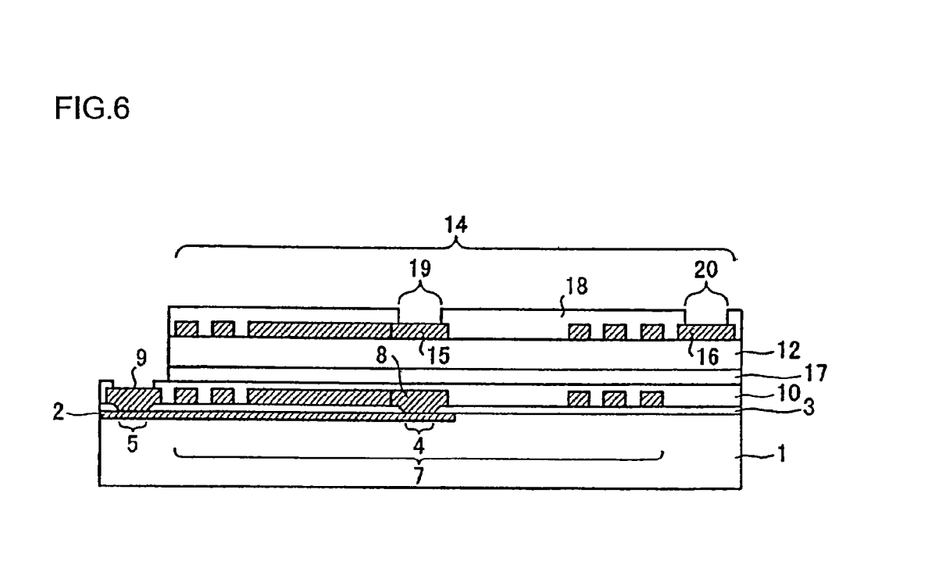
FIG. 6 is a sectional view showing a constitution of a micro-transformer manufactured by a manufacturing method according to Embodiment 3.

Next, as shown in FIG. 6, the face of that side of the insulator material 12 on which the secondary coil 14 is not formed is adhered to the insulating film 10 on the primary coil side by the adhesive tape 17. The face of the side of the secondary coil not having the secondary coil and the surface of the insulating film 10 on the primary coil side may be made more or less rough.

According to Embodiment 1, as has been described hereinbefore, the withstand voltage is retained by the insulator material 12 so that the insulating film 10 over the primary coil 7 can be thinner than the thickness necessary for the desired withstand voltage. Therefore, it is possible to prevent the drop of throughput, as might otherwise be invited by making the insulating film 10 thick. Moreover, the insulator material 12 is adhered by the adhesive tape 17 so that the insulator material 12 is not cracked by stress.

According to Embodiment 1, moreover, the pad 9 on the side of the primary coil and the outer-end pad are exposed to the outside while the primary coil side and the secondary coil side are adhered. This makes it unnecessary to perform etching to expose those pads to the outside after adhesion. As a result, it is possible to prevent a reduction in the throughput as might otherwise be caused by etching. Because of the absence of etching the thick insulating film, moreover, the micro-transformer can be manufactured without using a mask material having a high selection ratio.

Embodiment 2

The constitution of the micro-transformer manufactured by the manufacturing method according to Embodiment 2 of the invention is omitted on its description, because it is similar to that of the micro-transformer manufactured by the manufacturing method of Embodiment 1. Embodiment 2 is different from Embodiment 1 in the thickness of the insulator material 12 to be prepared separately of the semiconductor substrate 1. In Embodiment 2, the manufacturing method of FIG. 2 to FIG. 4, as have been described in Embodiment 1, are performed first.

Next, the secondary coil 14 is formed on the surface of the insulator material 12, as shown in FIG. 5. An insulator material 12 is used that is thicker than the thickness necessary for the desired withstand voltage. Next, the face of that side of the insulator material 12 on which the secondary coil 14 is not formed is ground to work the insulator material 12 to a thickness necessary for the desired withstand voltage. Specifically, the thickness of the insulator material 12 is set to about 20 to 200 µm. Then the primary coil side and the secondary coil side are adhered, as in Embodiment 1.

According to Embodiment 2, as has been described hereinbefore, when the secondary coil 14 is formed, the insulator material 12 is thick enough to prevent the insulator material 12 from being cracked. Moreover, the distance between the coils can be easily adjusted according to the application of the micro-transformer.

Embodiment 3

FIG. 6 is a sectional view showing a constitution of the micro-transformer, which is manufactured by the manufacturing method according to Embodiment 3 of the invention. As shown in FIG. 6, the micro-transformer, as manufactured by the manufacturing method according to Embodiment 3, has an insulating film 18 deposited on the secondary coil 14 of the micro-transformer manufactured by the manufacturing method according to Embodiment 1 or 2. In this insulating film 18, an opening 19 is formed over the center pad 15 of the secondary coil 14. Moreover, an opening 20 is formed over the outer-end pad 16 of the secondary coil. In short, the center pad 15 and the outer-end pad 16 of the secondary coil 14 are exposed to the outside at the openings 19 and 20.

Embodiment 3 is different from Embodiment 1 or 2 in that the insulating film is formed over the secondary coil after this secondary coil is formed. In Embodiment 3, the same portions as those of Embodiment 1 or 2 are designated by the common reference numerals, and their overlapped descriptions are omitted. In Embodiment 3, the manufacturing method of FIG. 2 to FIG. 4, as have been described in Embodiment 1, are performed first.

Next, the secondary coil 14 is formed on the insulator material 12, as shown in FIG. 5. Next, the insulating film 18 is deposited on the secondary coil 14 by the plasma CVD method or the like. The insulating film 18 is then partially removed by photolithography or the like to form the openings 19 and 20. Next, the primary coil side and the secondary coil side are adhered as in Embodiment 1 or 2. In case the insulator material 12 is polished as in Embodiment 2, the deposition of the insulating film 18 and the formations of the openings 19 and 20 are performed before polishing.

According to Embodiment 3, as has been described hereinbefore, it is possible to attain effects similar to those of Embodiment 1 or 2. Moreover, the secondary coil 14 is protected by the insulating film 18.

Embodiment 4

Figure 7:
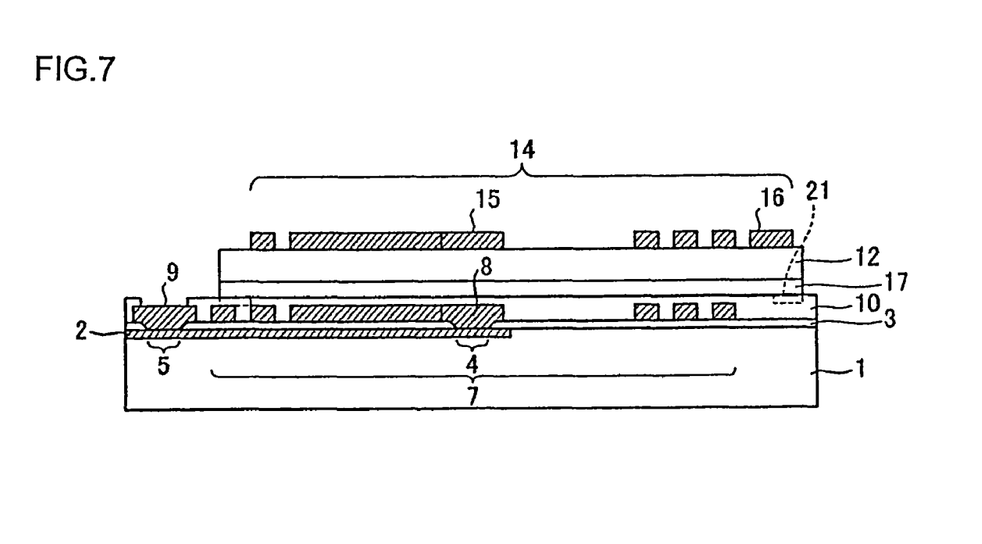
FIG. 7 is a sectional view showing a constitution of a micro-transformer manufactured by a manufacturing method according to Embodiment 4.

FIG. 7 is a sectional view showing a constitution of the micro-transformer, which is manufactured by the manufacturing method according to Embodiment 4 of the invention. As shown in FIG. 7, the micro-transformer, as manufactured by the manufacturing method according to Embodiment 4, has pattern registering markers 21 formed on the insulating film 10 on the primary coil side of the micro-transformer manufactured by the manufacturing method according to Embodiment 1 or 2. Moreover, the outer end of the face of that side of the insulator material 12, on which the secondary coil 14 is not formed, is adhered to match the pattern registering markers 21 by the adhesive tape 17.

Figure 8:
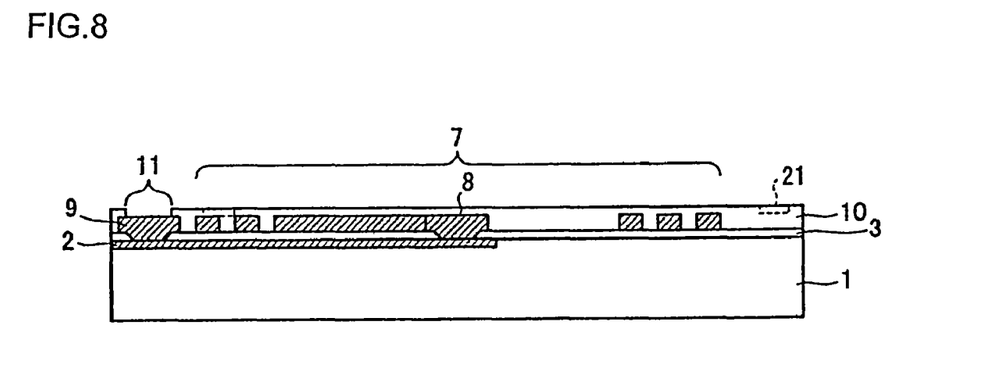
FIG. 8 is a sectional view showing formation of pattern registering markers in the micro-transformer manufacturing method according to Embodiment 4.
Figure 9:
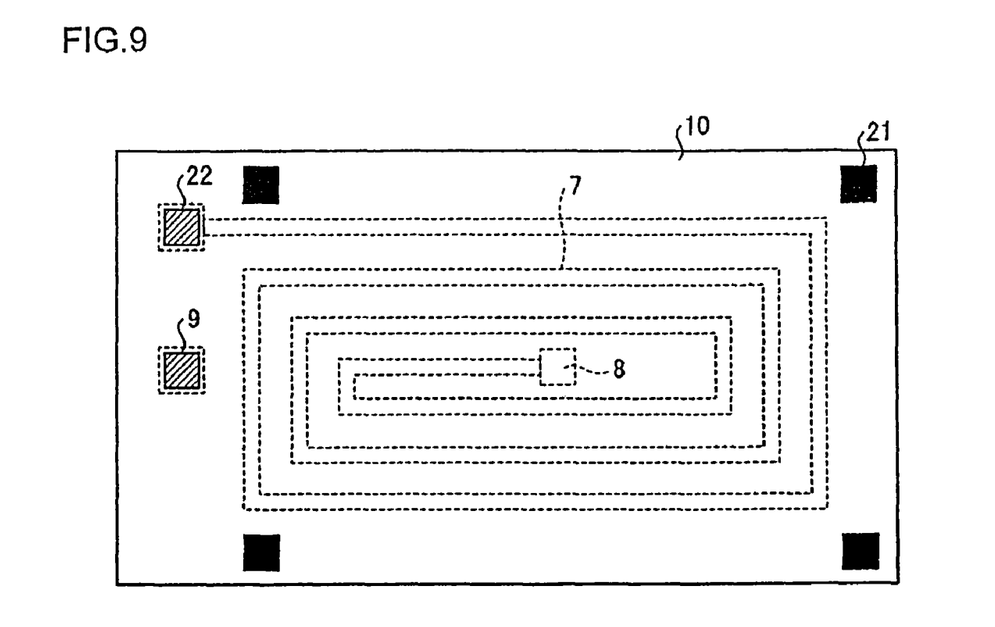
FIG. 9 is a top plan view showing pattern registering markers.

FIG. 8 is a sectional view showing the formation of pattern registering markers in a manufacturing method of the micro-transformer according to Embodiment 4 of the invention. FIG. 9 is a top plan view showing FIG. 8 downward. Here, Embodiment 4 is different from Embodiment 1 or 2 in that the pattern registering markers 21 are formed on the insulating film 10 after this insulating film 10 was formed on the primary coil 7. In Embodiment 4, the same portions as those of Embodiment 1 or 2 are designated by the common reference numerals, and their overlapped descriptions are omitted.

In Embodiment 4, the manufacturing method of FIG. 2 to FIG. 4, as have been described in Embodiment 1, are performed. Next, the insulating film 10 is partially removed by photolithography, thereby to form the pattern registering markers 21. These pattern registering markers 21 are formed at the four corners of the insulating film 10, for example, as shown in FIG. 8 and FIG. 9, in case the semiconductor substrate 1 has a rectangular shape. However, the area enclosed by the four pattern registering markers 21 is made not to contain the pad 9 and an outer-end pad 22 of the primary coil 7. The pattern registering markers 21 are reference markers for the time when the insulator material 12 is adhered onto the insulating film 10. Moreover, the pattern registering markers 21 are appropriately sized to have a width of about 10 µm and a depth of about 1 µm, for example.

Here, the shape, place and number of the pattern registering markers 21 may be different according to the shape of the semiconductor substrate 1. The pattern registering markers 21 may be so shaped, positioned and numbered as to adhere the primary coil side and the secondary coil side without any dislocation.

At the adhering time, the pattern registering markers 21 formed on the insulating film 10 are recognized through the insulator material 12 when this insulator material 12 is transparent. Then, the insulator material 12 can be adhered with reference to the pattern registering markers 21. In case the pattern registering markers 21 are opaque, on the other hand, the outer ends of the face of that side of the insulator material 12 on which the secondary coil 14 is not formed, may be registered to the pattern registering markers 21. In this case, the shape of the insulator material 12 is made smaller than the shape enclosed by the four pattern registering markers 21. Even when the insulator material 12 is opaque, the insulator material 12 can be adhered to the primary coil side with reference to the pattern registering markers 21.

According to Embodiment 4, as has been described hereinbefore, the insulator material 12 is adhered with reference to the pattern registering markers 21 formed on the insulating film 10. Therefore, the secondary coil side can be adhered to desired positions over the primary coil side. As a result, the dislocation in the horizontal direction can be eliminated between the primary coil 7 and the secondary coil 14. Moreover, Embodiment 4 can also be applied to Embodiment 3. In this case, too, similar effects can be attained.

Here, the invention employs the plasma CVD method for forming the insulating film, but the invention should not be limited thereto. Moreover, the invention employs photolithography for forming the coil and for removing the insulating film, but the invention should not be limited thereto. For example, the coil may also be formed by a direct circuit-drawing method, in which conductive ink or paste is directly applied or blown to the substrate or the insulator material.

As has been described hereinbefore, the micro-transformer manufacturing method according to the invention is useful for manufacturing the micro-transformer to perform signal transmissions between electrically insulated electric circuits, and is suitable for manufacturing the micro-transformer to perform the insulated transmissions of a control signal for indicating the conduction and non-conduction of a switching element to be used in a transfer device and a status signal of the switching element.

The invention has been described with respect to certain preferred embodiments thereof. It will be understood that modifications and variations are possible within the scope of the appended claims.

This application is based on, and claims priority to, Japanese Patent Application No: 2007-119638, filed on Apr. 27, 2007. The disclosure of the priority application, in its entirety, including the drawings, claims, and the specification thereof, is incorporated herein by reference.

What is claimed is:

1. A micro-transformer manufacturing method comprising the steps of:
   forming a primary coil by:
   forming an impurity-diffused region selectively on the surface of a semiconductor substrate,
   depositing a first insulating film on the surface of the semiconductor substrate having the impurity-diffused region,
   forming a first opening and a second opening in the first insulating film, wherein the first opening and the second opening reach the impurity-diffused region,
   depositing a first conductive film on the first insulating film,
   working the first conductive film into a desired shape around the portion of the first conductive film over the first opening,
   depositing a second insulating film on the first insulating film and the first conductive film, and
   removing a portion of the second insulating film to expose the portion of the first conductive film over the second opening; and
   forming a secondary coil by:
   forming a second conductive film on the surface of an insulator material, which is sized to have a smaller area than an area of the second insulating film;
   working the second conductive film into a desired shape; and
   adhering the secondary coil onto the second insulating film of the primary coil with the insulator material being positioned between the secondary coil and above the second insulating film, while maintaining the portion of the first conductive film over the second opening exposed, and without electrically connecting the exposed portion of the first conductive film over the second opening with the second conductive film.

2. A micro-transformer manufacturing method according to claim 1, wherein the secondary coil forming step further includes, after forming the second conductive film and working the second conductive film, grinding the face of that side of the insulator material on which the second conductive film is not formed, to thin the insulator material.

3. A micro-transformer manufacturing method according to claim 1, wherein the secondary coil forming step further includes, after forming the second conductive film and working the second conductive film, depositing a third insulating film on the insulator material and the second conductive film, and forming an opening in the third insulating film that reaches the second conductive film.

4. A micro-transformer manufacturing method according to claim 2, wherein the secondary coil forming step further includes, between forming and working the second conductive film and grinding the insulator material, depositing a third insulating film on the insulator material and the second conductive film, to form an opening in the third insulating film that reaches the second conductive film.

5. A micro-transformer manufacturing method according to claim 1, wherein:
   the primary coil forming step further includes the step of, after depositing the second insulating film, forming pattern registering markers for adhering the secondary coil to the second insulating film, and
   the secondary coil adheres onto the second insulating film of the primary coil with reference to the pattern registering markers, with the insulator material being positioned below the secondary coil and above the second insulating film.

6. A micro-transformer manufacturing method according to claim 5, wherein the insulator material is sized so that the insulator material does not entirely cover the pattern registering markers formed on the second insulating film.

* * * * *